(12) United States Patent
Tosato

(10) Patent No.: US 9,106,466 B2
(45) Date of Patent: *Aug. 11, 2015

(54) WIRELESS COMMUNICATION APPARATUS

(75) Inventor: Filippo Tosato, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/610,974

(22) Filed: Sep. 12, 2012

(65) Prior Publication Data

US 2013/0064274 A1 Mar. 14, 2013

Related U.S. Application Data

(62) Division of application No. 12/495,042, filed on Jun. 30, 2009.

(30) Foreign Application Priority Data

Jul. 1, 2008 (GB) .................................. 0812032.1

(51) Int. Cl.
*H03K 7/10* (2006.01)
*H04L 25/03* (2006.01)
*H03M 7/30* (2006.01)

(52) U.S. Cl.
CPC ....... *H04L 25/03898* (2013.01); *H03M 7/3082* (2013.01)

(58) Field of Classification Search
CPC ........... H04L 1/06; H04L 1/02; H04L 1/0618; H04L 1/0625; H04L 1/0631; H04L 1/0675; H04L 1/0687; H04L 1/0693

USPC ......... 375/140, 146, 147, 240.3, 240.22, 260, 375/267, 295, 299

See application file for complete search history.

(56) References Cited

U.S. PATENT DOCUMENTS

| | | | |
|---|---|---|---|
| 5,890,110 A | 3/1999 | Gersho et al. | |
| 6,018,707 A | 1/2000 | Nishiguchi et al. | |
| 6,606,592 B1 | 8/2003 | Cho et al. | |
| 8,055,192 B2 | 11/2011 | Park et al. | |
| 8,077,664 B2 * | 12/2011 | Zangi | 370/328 |
| 8,116,391 B2 * | 2/2012 | Mielczarek et al. | 375/260 |
| 8,254,486 B2 | 8/2012 | Shi et al. | |
| 8,649,455 B2 * | 2/2014 | Clerckx et al. | 375/267 |
| 2004/0176950 A1 | 9/2004 | Chu | |
| 2007/0027684 A1 | 2/2007 | Byun et al. | |
| 2008/0080449 A1 * | 4/2008 | Huang et al. | 370/342 |
| 2008/0108310 A1 * | 5/2008 | Tong et al. | 455/69 |
| 2013/0202056 A1 * | 8/2013 | Lin et al. | 375/267 |

FOREIGN PATENT DOCUMENTS

WO   WO 2008/155707 A1   12/2008

* cited by examiner

*Primary Examiner* — Dac Ha
(74) *Attorney, Agent, or Firm* — Oblon, McClelland, Maier & Neustadt, L.L.P.

(57) ABSTRACT

Processing data presented in the form of a vector representation involves representing direction of the vector with incremental accuracy by using a set of vector codebooks of decreasing dimensions per accuracy increment.

9 Claims, 8 Drawing Sheets

WIRELESS COMMUNICATION APPARATUS

CROSS-REFERENCE TO RELATED APPLICATIONS

This application is a division of and claims the benefit of priority under 35 U.S.C. §120 from U.S. Ser. No. 12/495,042 filed Jun. 30, 2009, the entire contents of which are incorporated herein by reference. U.S. Ser. No. 12/495,042 claims the benefit of priority under 35 U.S.C. §119 from United Kingdom Application No. 0812032.1 filed Jul. 1, 2008.

The present invention is concerned with coding and/or decoding in the context of wireless communications apparatus. It is applicable to, but not exclusive to, mobile telephones, base stations, WLAN with multiple antennas, vocoders and other data compression processors, and positioning systems requiring incremental refinement of positional information (such as for GPS applications).

Vector quantisation is a family of source coding (or data compression) techniques whereby an input sequence of symbols is represented by a codeword drawn from a given codebook according to some minimum-distortion criterion.

In some applications, the most important information about the input vector that has to be accurately represented is its "direction". The concept of vector direction is associated with the concept of vector space spanned by a given vector; that is, all vectors that differ by a scaling coefficient are characterised by the same direction.

For example, if v is an M-dimensional complex vector and $\alpha \neq 0$ is an arbitrary complex scalar, then v and $\alpha$v have the same direction. Direction quantisation is obtained by using vector quantisation codebooks formed by unit vectors distributed on the M-dimensional complex sphere, for example. This explains the name of spherical vector quantisation. One typical distortion measure used in spherical vector quantisation is the chordal distance, which, for two vectors u and v is defined as $$d(u, v) = \sqrt{1 - \frac{|\langle u, v \rangle|^2}{\|u\|^2 \|v\|^2}}, \quad (1)$$

where $\langle u, v \rangle = v^H u$ denotes the inner product and $\|u\|$ the Euclidean norm.

Thus, the two linearly dependent vectors, v and $\alpha$v, have zero chordal distance, whereas two orthogonal vectors have maximum chordal distance, equal to 1. A spherical vector quantiser selects the codebook representative, $c \in C$, for an input vector v, with minimum chord distance, following the rule $$c = \underset{\bar{c} \in C}{\operatorname{argmin}} d(v, \bar{c}).$$

In many vector quantisation applications, it is desirable to provide a description of input vectors that can be considered as a refinement of previous descriptions. For example, a message may be described with a particular amount of distortion and then a decision can be taken thereafter that the message needs to be specified more accurately. Then, when an addendum to the original message is sent, this refinement is presumed to be as efficient as if the stricter requirement had been used for the initial description.

In these multi-stage quantisation schemes, the goal is to operate as close as possible to the rate-distortion bound after each refinement stage. Another example where it may be desirable to add information on previous descriptions is in the encoding of correlated sources, to reduce the amount of redundant information. Instead of quantising the samples of a correlated vector process independently, some form of differential or hierarchical encoding can be applied to these samples.

Two example constructions that have been also used for spherical vector quantisation will now be described.

1) Hierarchical Codebook Construction.

Two (or more) spherical codebooks are designed with a "nested" structure. The finer codebook is built as a collection of several smaller codebooks, one for each of the quantisation regions of the coarse codebook. Each of these finer constituent codebooks has code-vectors distributed in one particular quantisation region of the coarse codebook. The two-stage coding principle is clear: as long as the source vector is confined within one quantisation region of the coarse codebook, the description can be refined by using the finer codebook, otherwise the description is updated from the coarse codebook.

2) Differential Encoding.

In this case, quantisation regions close in chordal distance are assigned to codewords close in Hamming distance. For a given sample input vector the difference between the actual quantisation index and the previous index is encoded. Therefore, if the vector process is correlated sufficiently, only the least significant bits of the code message need to be communicated to the decoder. The most significant bits will be sent only when the source has experienced an abrupt change.

Spherical vector quantisation (SVQ) is described, for example, in D. Love, R. Heath, and T. Strohmer, "Grassmannian beamforming for multiple-input multiple-output wireless systems," *IEEE Trans. Inform. Theory*, vol. 49, no. 10, pp. 2735-2747, Oct. 2003. A hierarchical codebook design method for SVQ has recently been proposed in J. Kim, W. Zirwas, and M. Haardt, "Efficient feedback via subspace-based channel quantization for distributed antenna systems with temporally correlated channels," *EURASIP J Advances in Signal Processing*, 2008.

However, the above references do not address refinement of directional quantisation of a vector source. This finds application for example in the encoding of channel state information for feedback and other source coding problems. Ordinary techniques for directional vector quantisation generally perform a single-stage quantisation and achieve a fixed resolution, whereas in many situations it is desirable to dynamically change the accuracy of the vector representation during the encoding process. In this case, it is more efficient to add information to previous descriptions of a source rather than performing a new quantisation with a finer codebook.

One other problem not addressed by the prior art is the provision of directional quantisation of a correlated vector source with adaptive resolution and constant rate.

The problem can be best illustrated by an example. In this example, it is desired to describe the "direction" of a continuous-time correlated vector source, by sampling and quantising the source at fixed time instants. The codebook index transition rate over time or, in other words, the rate at which the quantisation index changes over time, depends on the sampling rate and on the codebook size, which also determines the resolution of the vector quantiser. If the codebook provides the same code index over several consecutive quantisation events, there is clearly a waste of resources. This redundancy could be removed, for example, by reducing the sampling rate while keeping the same codebook size, by enlarging the codebook for the same sampling rate, or by adjusting both parameters.

There are applications where it is desirable 1) to keep the sampling rate and the message size at each quantisation event fixed, and 2) to operate with very few pre-defined codebooks. This is the case, for example, for mobile stations (MS) having to report periodically their channel directions to a base station (BS). In such a case, the BS may want to avoid negotiating the feedback rate every so often with each individual MS.

These problems can also be addressed by hierarchical codebook construction or differential encoding techniques. However, designing these nested codebooks according to some optimality criteria is generally difficult and the construction is unique for a given channel vector dimension. In fact, all codebooks in the hierarchy have to have the same dimensionality: if the same codec has to operate with different vector dimensions, different sets of codebooks must be provided for each input dimension.

An aspect of the present invention provides an SVQ scheme using "off-the-shelf" and scalable codebooks. In particular, in such aspect of the present invention, the codebook dimension is reduced by one at each refinement stage, which further reduces the encoding complexity, and the codebooks are designed separately. Besides, the same codebook of dimension n−1, defined for the first refinement stage of a dimension-n vector source, can be used for the initial quantisation stage of an (n−1)-dimensional vector.

An aspect of the invention provides a coder architecture that provides a representation of an input vector direction with incremental accuracy by using a set of vector codebooks of decreasing dimensions.

An aspect of the invention provides a decoder architecture that provides a representation of an input vector direction with incremental accuracy by using a set of vector codebooks of decreasing dimensions.

An aspect of the invention provides an encoding procedure for constructing a basis set of orthogonal reference vectors from a set of codebooks of decreasing dimensions, such that a truncated representation of a vector by the first n components in the new reference system, introduces a chordal distortion bounded above by the product of maximum chordal distances associated with the first n codebooks.

An aspect of the invention provides an encoding procedure for describing with incremental accuracy the direction of vectors of different dimensions, by using the same set of quantisation codebooks.

It will be appreciated that the nature of the invention lends itself to implementation by computer means, such as involving a computer program product. This product can be introduced as computer executable code, such as on a storage medium or a signal carrier, or as a hardware device such as an FPGA, a DSP or an ASIC.

Other aspects of the invention will become apparent from the following description of a specific embodiment of the invention, with reference to the accompanying drawings, in which.

The main structural difference between the embodiment of the present invention described herein and other methods for directional vector quantisation is that, in other techniques, the directional information can be refined by designing tree-structured codebooks, wherein each refinement codebook, apart from the initial one, can be partitioned into as many sub-sets as the number of quantisation regions of the coarse codebook one level up the tree structure. Therefore, all the codebooks in the hierarchy have the same dimensionality, and can be used for quantisation of just one particular vector dimension. The reader will recognise that the dimension of a codebook denotes the size of its vector components, and its size indicates its cardinality, that is the number of elements in the codebook.

Conversely, in this described embodiment of the invention, each refinement codebook has one dimension less than the parent codebook and is designed independently of the others. Therefore, the embodiment can use readily available codebooks, each of which is good for directional quantisation in its dimension, and can use the same codebooks for quantising vectors of different dimensions with various refinement depths.

Figure 11:
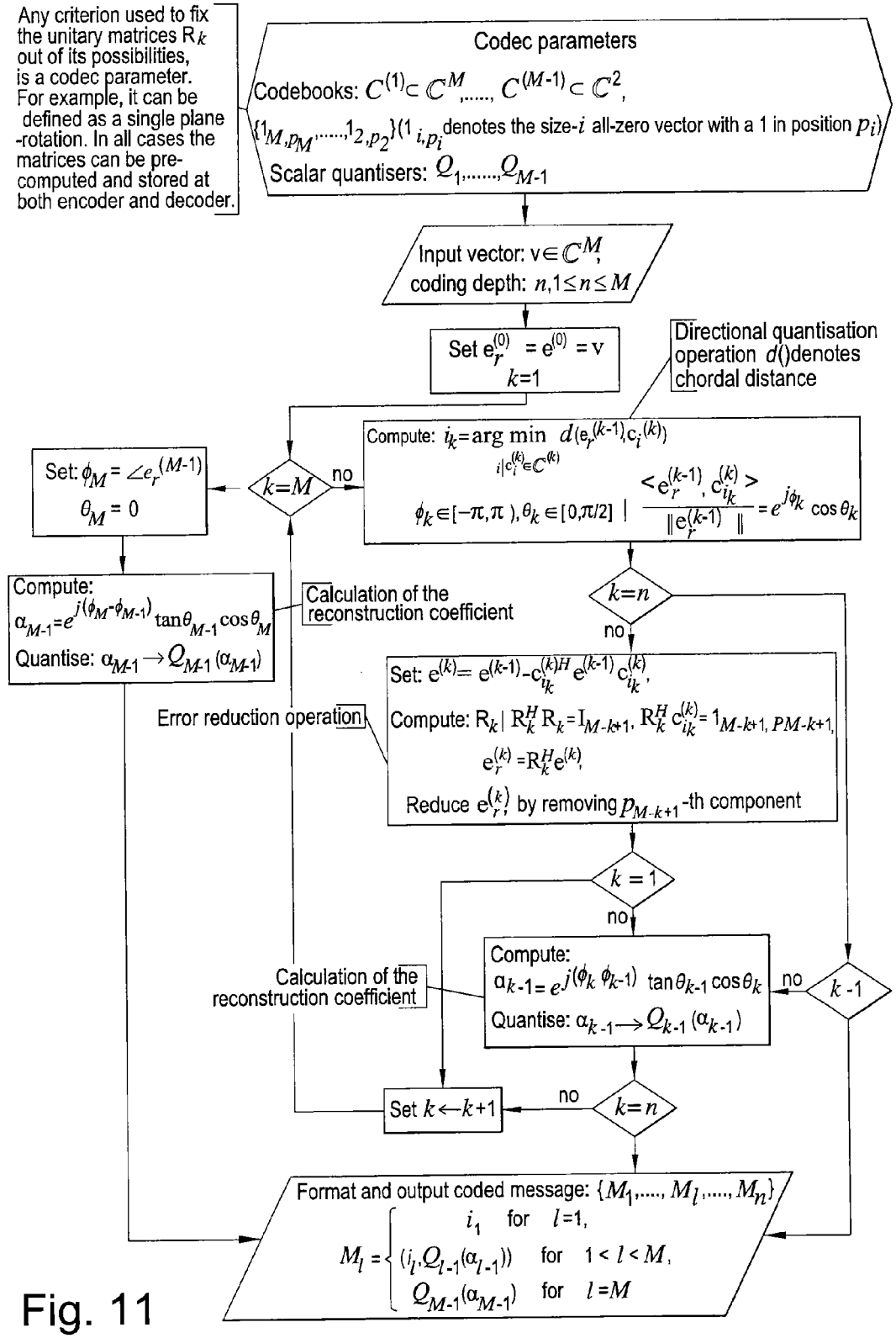
FIG. 11 shows a flow diagram of an encoder process in accordance with the described embodiment of the invention.

FIG. 11 shows the flow diagram of the operations carried out by the encoder to quantise the direction of a vector $v \in C^M$ with a refinement depth n, with $1 \le n \le M$. It should be noted that the case n=1 corresponds to a single-stage directional quantisation of the input vector with a codebook $C^{(1)} \subset C^M$. Also it should be noted that the same set of codebooks, $C^{(1)} \ldots C^{(M-1)}$, defined for this codec can be used for directional quantisation of complex vectors with dimension N, with N<M, and up to N refinement stages. Besides the codebooks, the codec parameters include a vector component of choice for each dimension, M, M−1, ..., 2, which indicates the component of the error vector to be nulled in the reduction operation that takes place before each refinement operation. The i-dimensional error vector component is indicated in FIG. 11 by an elementary vector $1_{i,p_i}$, which denotes an all-zero vector with a 1 in position $p_i$. Another set of codec parameters are given by M−1 scalar quantisers. These are used for quantising the reconstruction coefficients generated by the refinement stages. Error analysis shows that it is possible to guarantee refinement of the quantised direction (i.e. reduction in chordal distortion) with very coarse representation of these reconstruction coefficients, namely zero-bit quantisation for amplitude and less than 2 bits for phase. Two examples of how these scalar quantisers can be designed are illustrated in the numerical example later in this description. However, the granularity and parameters of these scalar quantisers may vary depending on the application, and without changing the nature of the vector quantisation technique, so they are not specified further in FIGS. 11 and 12.

Three main structural blocks can be identified in FIG. 11, which denote the fundamental operations carried out by the encoder at each stage.

A directional vector quantisation operation is applied to the reduced error vector, $e_r^{(k-1)}$, of dimension M−k+1. The distortion measure, $d(e_r^{(k-1)}, c_i^{(k)})$, used in this vector quantisation, denotes chordal distance, as defined in equation (1). This operation is not carried out in the M-th stage, as the error vector $e_r^{(m-1)}$ reduces to a scalar quantity.

An error reduction operation reduces by one the dimension of the error vector. The error vector is defined as the "chord" between the input vector $e_r^{(k-1)}$ in the directional quantisation operation and the output quantisation vector $c_{i_k}^{(k)}$.

It should be noted that the unitary matrix involved in the reduction operation is uniquely identified by the codec parameters, namely the codebook vectors, the error components to be nulled and the fact that it consists of a single plane-rotation. Therefore the matrix quantities $R_k$ can be pre-computed and stored at both the encoder and decoder. It should be noted that there exist an infinite number of other unitary matrices that perform the same error reduction operation, therefore different assumptions could be made to fix one particular transformation. Any such criterion to select $R_k$ out of its possibilities is assumed to be known at the both encoder and decoder (this does not apply if the matrices are pre-computed and stored), and does not change the nature of the encoding technique.

Calculation of the reconstruction coefficient yields the combination coefficients required for perfect reconstruction of the vector v direction. This operation is carried out from the second stage onwards, as one coefficient is required in order to combine two directional vector indications. The fundamental reconstruction step can be easily derived from the definition of the "chordal error" vector, which reads:

$$e^{(k)} = e^{(k-1)} - <e^{(k-1)}, c_{i_k}^{(k)}> c_{i_k}^{(k)},$$

where the notation of FIG. 11 is used. After normalising the expression, the fundamental reconstruction formula is obtained, which appears in FIG. 12, with the following notation (the combination coefficient there is replaced by its quantised version)

$$\hat{e}_r^{(k-1)} = c_{i_k}^{(k)} + \alpha_k \hat{e}_r^{(k)}. \quad (2)$$

It should be noted that the directional information contained in the error vectors involved in the two expressions above is maintained, although they differ by a complex multiplication coefficient.

In another implementation, a different reconstruction formula may be used, which maintains the directions of the vectors involved. The general formula is obtained from (2) by a multiplication by a complex scalar coefficient, $\beta_k$, and reads:

$$\hat{e}_r^{(k-1)'} = \beta_k c^{(k)} + \alpha_k \hat{e}_r^{(k)'}.$$

Another structural property of the construction is that, say $\hat{v}_m$ the reconstructed vector using m refinement stages. Then, if the reconstruction coefficients, $\alpha_k$, k=1, . . . , m−1, are known exactly at the decoder, the final distortion is the product of distortions associated with the quantisation stages (it should be noted that the distortion measure is a positive number between 0 and 1), i.e.

$$d(\hat{v}_m, v) = \prod_{k=1}^{m} d(e_r^{(k-1)}, c_{i_k}^{(k)}).$$

If the reconstruction coefficients are quantised, it can be shown that under very mild constraints on the accuracy of the scalar quantisers, distortion reduction can be guaranteed at each refinement stage, that is:

$$d(\hat{v}_m, v) < d(\hat{v}_{m-1}, v) < \ldots < d(\hat{v}_1, v).$$

Figure 12:
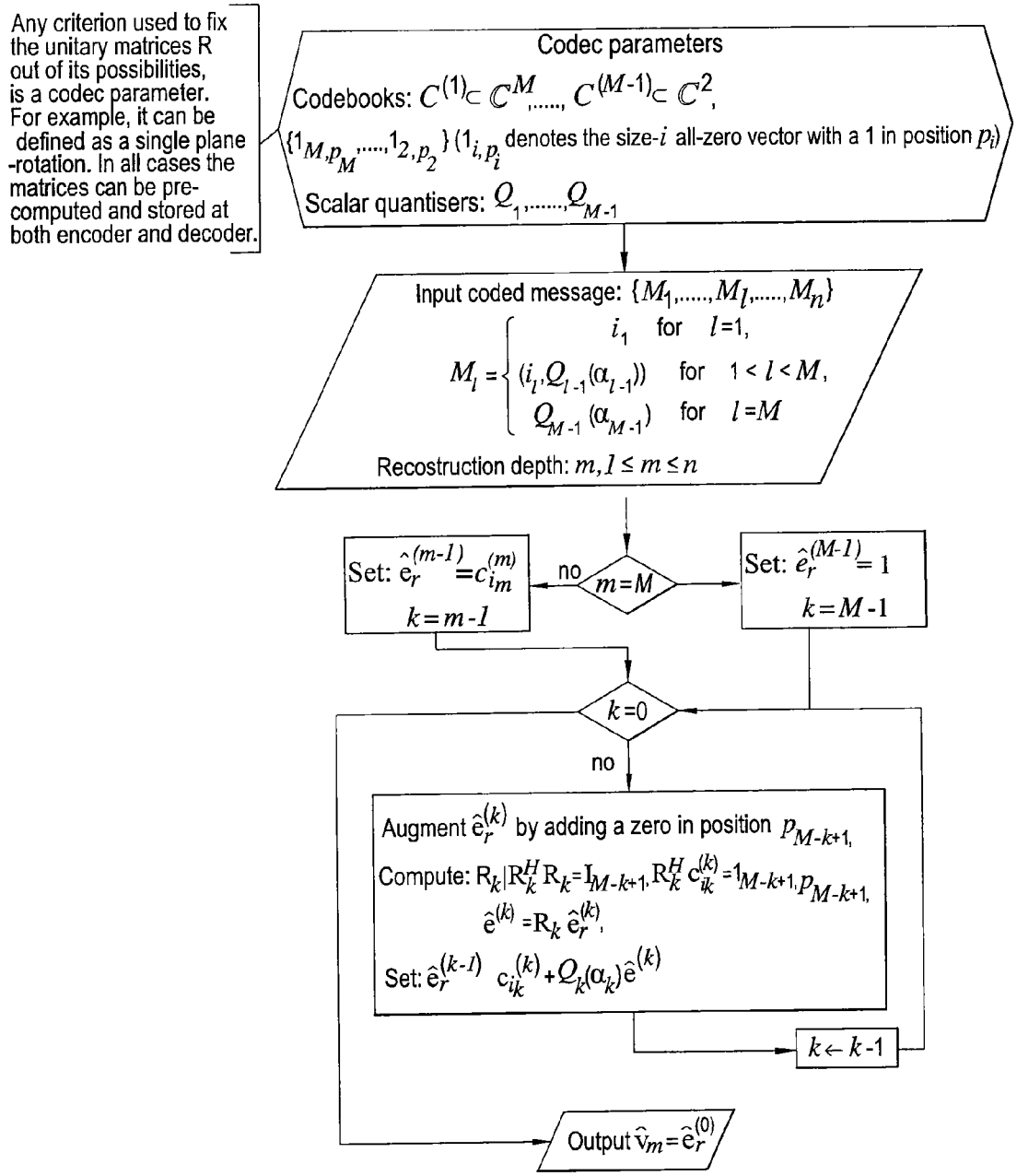
FIG. 12 shows a flow diagram of a decoder process in accordance with described embodiments of the invention.

FIG. 12 shows the flow diagram of the decoder operations, which can be readily derived from the encoder diagram. The main structural block, which is shown in the middle of the loop in FIG. 12, consists of two operations:

Error augmentation, which is the reverse operation of the error reduction step carried out by the encoder; and Error reconstruction, which implements the reconstruction formula (2) in a recursive fashion.

It should be noted that the decoder need not know the full encoded message up to the maximum refinement depth, in order to reconstruct the vector direction. In fact, reconstruction of the source vector can take place after each refinement message is received, generating increasingly accurate estimates of the vector direction.

Figure 1:
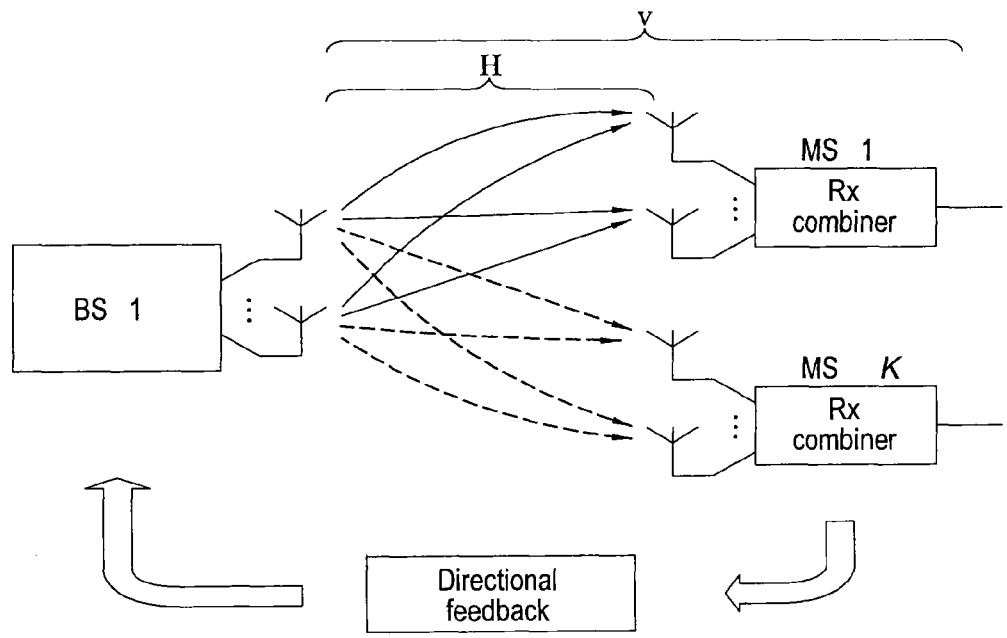
FIG. 1 is a schematic diagram of a wireless communications network in accordance with an embodiment of the invention.

One application for which embodiments of the present invention are envisaged to offer clear benefits is in the encoding of channel state information (CSI) for feedback purposes. Taking as an example a cellular or WLAN system, where the base station (BS) uses M antennas for transmission, where, to fix ideas, M can be 2, 3 or 4, and there is a multiplicity of mobile stations (MS) that have to report periodically their channel signature to the BS. This channel signature may consist of a complex M−dimensional vector, represented by vector v in FIG. 1, which illustrates this example system configuration.

In a conventional system a single codebook is defined for each possible number of BS transmit antennas in use, i.e. $C^{(1)} \subset C^4$, $C^{(2)} \subset C^3$, $C^{(3)} \subset C^2$ in the present example. Each MS is obliged to report a feedback message every $\tau_f$ seconds, which consists of the codebook index, $i_1$, resulting from a minimum chordal distance quantisation of the vector of channel measurements with codebook $C^{(4-M+1)}$. If a particular MS reports the same codebook index, on average, for two consecutive time intervals, this means that the channel coherence time is roughly $2\tau_f$ and the feedback can be made more resource efficient in at least two ways: by either defining a finer codebook for any possible dimension M, or by reducing the feedback interval. Either solution can be impractical, as each requires introduction of new codebooks and/or negotiation of different feedback report rates for each MS.

The present embodiment of the invention provides an attractive solution to the problem, without the drawbacks of new codebook definitions and/or variable feedback report rates: the MS can report index $i_1$ at times $0, 2\tau_f, 4\tau_f, \ldots$, i.e. using a coarser time interval, $\tau_c = 2\tau_f$, whereas a refinement message is sent on odd times $\tau_f, 3\tau_f, 5\tau_f \ldots$ Refinement is achieved by using codebook $C^{(4-M+1)}$, for M=4, 3, while no codebook is required in the case M=2. The refinement message consists, in general, of an index $i_2$ and a quantised reconstruction coefficient, $Q_1(\alpha_1)$, which can be encoded together in such a way, for example, that the coded message size is the same in all feedback reports.

Figure 13:
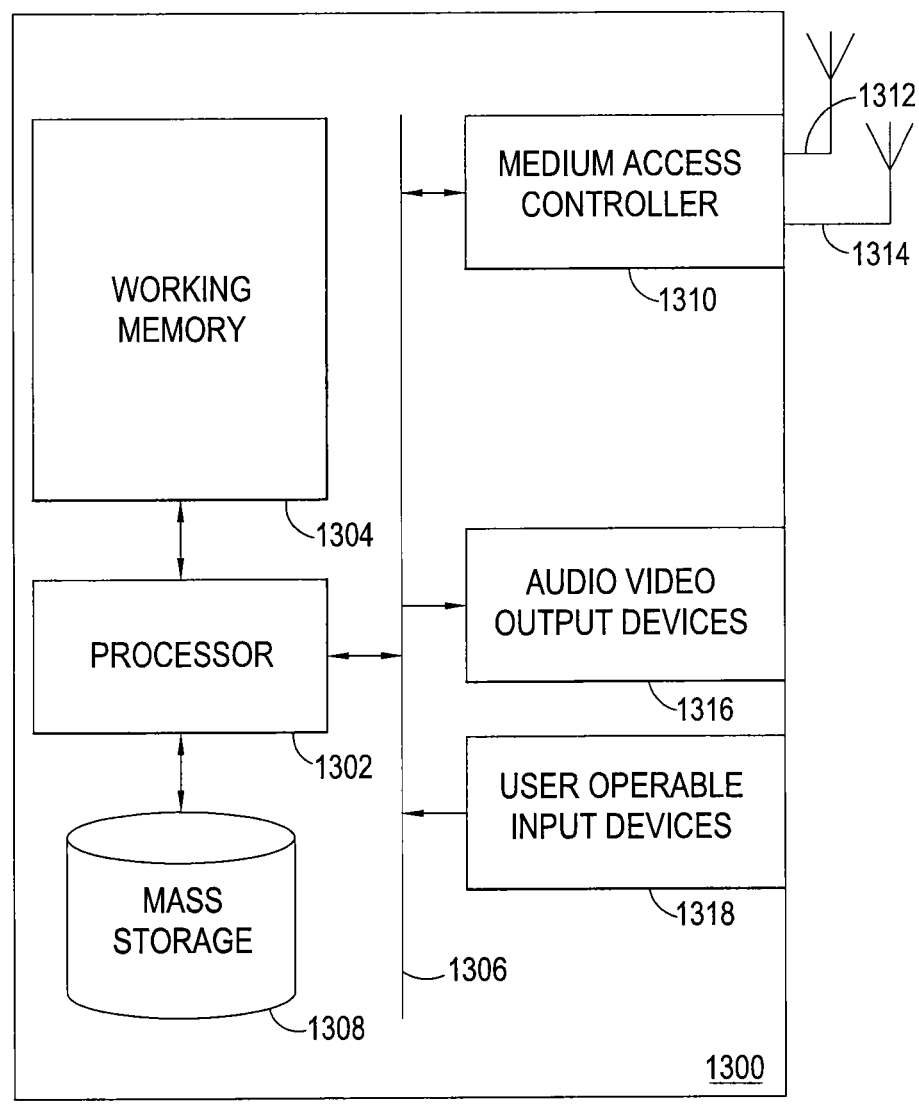
FIG. 13 illustrates a practical implementation of communication apparatus suitable for configuration either as the encoder or the decoder of the described embodiment of the invention.

In the exemplary network of FIG. 13, each of the base station and mobile station is equipped with the technology to enable establishment of wireless communication. Exemplary mobile stations include mobile phones, Personal Digital Assistants (PDA), general purpose computers, integrated devices combining one or more of the preceding devices, and the like. The base station may be a general-purpose computer, standard laptop, fixed terminal, or other electronic device configured to transmit, receive and process data according to an air interface method.

FIG. 13 shows a station 1300 according to a specific embodiment of the present invention. In the embodiment of FIG. 13, the station 1300 is implemented by means of a general-purpose computer with communications facilities. In this specific embodiment, communications facilities are provided by means of hardware, which is in turn configured by means of software. More particularly, the station 1300 comprises a processor 1302, in communication with the working memory 1304 and a bus 1306. A mass storage device (which, in this case, is a magnetic storage device, though other such storage devices would suffice) 1308, is provided for long term storage of data and/or programs not in immediate use. A medium access controller 1310 is connected to a plurality (two in this case) of antennas 1312, 1314. The medium access controller 1310 will manage the station's access to the communications medium.

By means of the bus 1306, user operable input devices 1318 are in communication with the processor 1302. The user operable input devices 1318 comprise any means by which an input action can be interpreted and converted into data signals, for example, DIP switches. Audio/video output devices 1316 are further connected to the general-purpose bus 1306, for the output of information to a user. Audio/video output devices 1316 include any device capable of presenting information to a user, for example, status LEDs.

Figure 2:
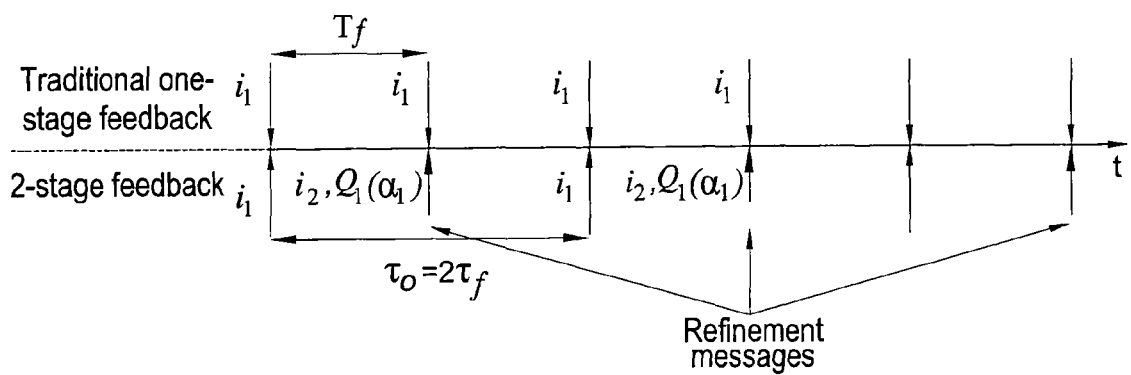
FIG. 2 is a timing diagram of feedback time frames for a traditional one-stage directional quantisation and a 2-stage feedback with refinement.

FIG. 2 illustrates the CSI feedback concept described above, compared to a traditional one-stage scheme. The details of how the codec operates will now be described by way of a numerical step-by-step example. The example considers a three-dimensional real vector for ease of geometrical representation; however, it will be appreciated by the reader that the method applies to complex vectors as well and to any vector dimension.

EXAMPLE 1

Let $v=[-0.0624 \ -0.1168 \ -0.9912]^T$ be the vector for which representation of direction is desired. Without loss of generality, the vector norm has been normalised to 1. Two codebooks are defined for directional quantisation in 3 and 2 dimensions, respectively, each consisting of 4 code-vectors:

$$C^{(1)} = \begin{bmatrix} -0.7416 & -0.1266 & 0.8759 & -0.0077 \\ 0.1716 & 0.5723 & 0.2195 & -0.9634 \\ -0.6485 & 0.8102 & -0.4296 & 0.2680 \end{bmatrix},$$

$$C^{(2)} = \begin{bmatrix} -0.7830 & -0.1138 & 0.6220 & 0.9935 \\ -0.6220 & -0.9935 & -0.7830 & -0.1138 \end{bmatrix}.$$

At each refinement stage, it is assumed that the error vector component to be nulled is the last—this assumption will appear clear later in the example. Any other component can be chosen for each refinement stage, provided that coder and decoder share the same information.

Coding
Stage 1.

Figure 3:
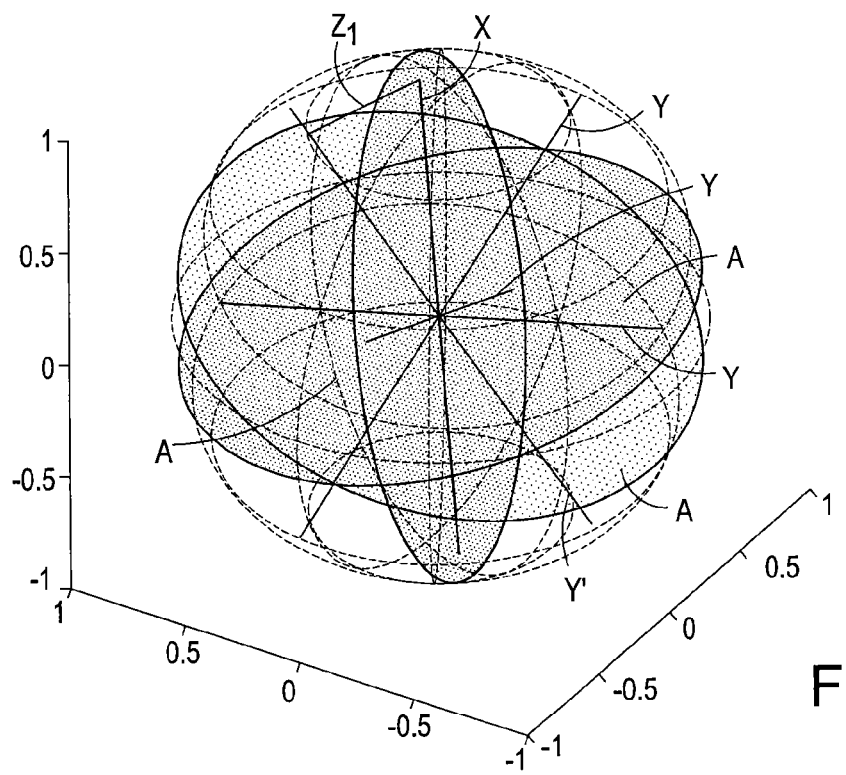
FIG. 3 is a graph depicting a first stage of the encoding process of the described embodiment of the invention.

Codebook $C^{(1)}=\{c_0^{(1)}, \ldots, c_3^{(1)}\}$ is used for quantising v with minimum chordal distance. FIG. 3 shows the direction of vector v (x) and that of the four code vectors (y,y$^1$). The three separation planes (A) are shown in shaded representation, which delimit the four quantisation regions. It should be noted that the quantisation regions are symmetrical with respect to the origin.

Hence, the first quantisation operation yields the index $$i_1 = \arg\min_{i \in [0,\ldots,3]} d(v, c_i^{(1)}) = 1.$$

The selected code-vector representative is marked in bold ($y^1$) in FIG. 3.

Stage 2.

FIG. 3 shows the "chord" ($Z_1$) $e^{(1)}=v-c_1^{(1)T}vc_1^{(1)}$, of length $d(v,c^{(1)}_1)$, which identifies the direction to be quantised at the second stage. Note that this direction is perpendicular to $c^{(1)}_1$. Code vector $c^{(1)}_1$ uniquely identifies an orthogonal transformation (i.e. isometry), $R_1=B_1G_1^H B_1^H$, where $B_1$ is a basis-change matrix and $G_1$ applies a single plane-rotation, and such that $R_1^T c_1^{(1)}=[0\ 0\ 1]^T$. This is computationally inexpensive to calculate and reads $$R_1 = \begin{bmatrix} 0.9912 & 0.0400 & -0.1266 \\ 0.0400 & 0.8190 & 0.5723 \\ 0.1266 & -0.5723 & 0.8102 \end{bmatrix}.$$

Besides, as noted above, these matrices can be pre-computed and stored beforehand, as they depend solely on the codebook vectors and on the error component to be nulled.

This transformation is also such that $R_1^T e_1 = [e_r^{(1)T}\ 0]^T$, where the last component of the error vector has been nulled, according to the initial assumption. Therefore, a new directional quantisation can be applied to the reduced error vector $e_r^{(1)}$ by using codebook $C^{(2)}=\{c_0^{(2)}, \ldots, c_3^{(2)}\}$. The second stage quantisation index is given by $$i_2 = \arg\min_{i \in [0,\ldots,3]} d(e_r^{(1)}, c_i^{(2)}) = 2.$$

Besides this, a combination coefficient must be calculated. Firstly, some essential notation regarding the following two inner products will be explained:

$$\frac{\langle v, c_1^{(1)} \rangle}{\|v\|} = e^{j\phi_1}\cos\theta_1,$$

$$\frac{\langle e_r^{(1)}, c_2^{(2)} \rangle}{\|e_r^{(1)}\|} = e^{j\phi_2}\cos\theta_2,$$

where $\cos\theta_1, \cos\theta_2 \in [0,1]$, while $\phi_1, \phi_2 \in \{-\pi, 0\}$, in the real case ($\phi_1, \phi_2 \in [-\pi, \pi)$ in the complex case). The combination coefficient of interest is given by $$\alpha_1 = e^{j(\phi_2 - \phi_1)}\tan\theta_1 \cos\theta_2 = 0.5646. \qquad (3)$$

Figure 4:
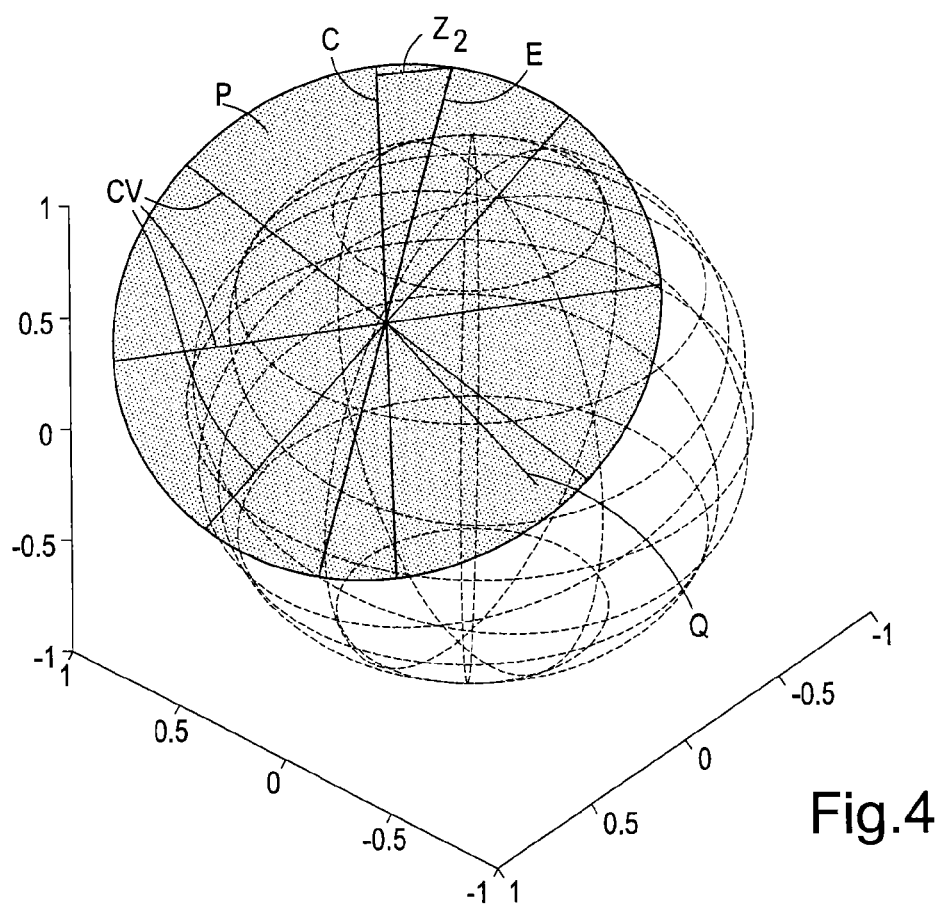
FIG. 4 is a graph depicting a second stage of the encoding process.

FIG. 4 shows the plane (P) where the stage-2 directional quantisation takes place. It will be noted that the plane is normal to $c_1^{(1)}$ (the direction of which direction is plotted in dashed line Q). The direction of $e_r^{(1)}$ is drawn in bold and labelled E, that of $c_2^{(2)}$ in bold and labelled C, while the other solid lines CV depict the directions of the code vectors in $C^{(2)}$. The dashed line V denotes the direction of v.

Stage 3.

FIG. 4 shows the "chord" ($Z_2$) $e^{(2)} = e_r^{(1)} - c_2^{(2)T} e_r^{(1)} c^{(2)}$ of length $d(e_r^{(1)}, c_2^{(2)})$, which identifies the direction orthogonal to the vectors $\{c_1^{(1)}, R_1[c_2^{(2)T} 0]^T\}$. Clearly, it is not necessary to quantise the direction of this last error vector, as it is uniquely and exactly described by the pair $(c_1^{(1)}, c_2^{(2)})$ and the convention of which component to null (the last in the present example). In fact if, as in the previous stage, the isometry $R_2 = B_2 G_2^H B_2^H$ is calculated, such that $R_2^T c_2^{(2)} = [0\ 1]^T$, this transformation yields $R_2^T e^{(2)} = [e_r^{(2)}\ 0]^T$, where $e_r^{(2)}$ is a scalar. This unitary matrix reads $$R_2 = \begin{bmatrix} -0.7830 & 0.6220 \\ -0.6220 & -0.7830 \end{bmatrix}.$$

Therefore, the direction of $e^{(2)}$ is exactly described by the unit vector $R_2[1\ 0]^T$, and the degenerate third-stage quantisation vector is given by the scalar $c^3 = 1$. The "inner product" associated with this pseudo quantisation stage is given by $$\frac{\langle e_r^{(2)}, c^{(3)} \rangle}{\|e_r^{(2)}\|} = e^{j\phi_3} \cos\theta_3 = e^{j\phi_3},$$

and the combination coefficient reads $$\alpha_2 = e^{j(\phi_3 - \phi_2)} \tan\theta_2 \cos\theta_3 = 0.2908. \quad (4)$$

Figure 5:
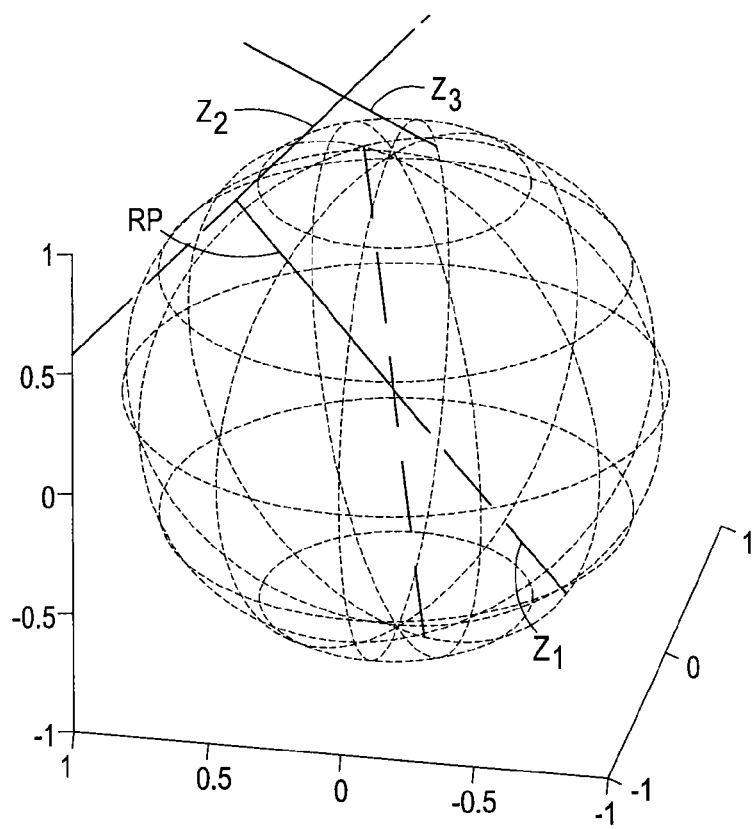
FIG. 5 is a graph depicting a third stage of the encoding process.

FIG. 5 shows the direction $Z_3$ associated with the third stage, while in dashed line are the two directions $(Z_1, Z_2)$ identified in the previous stages. The "refinement path" RP is plotted along the three orthogonal directions. It will be noted that the line passing through the initial and final points of the path represents exactly the direction of vector v. In other words the procedure followed has identified a set of reference axes, i.e. a vector basis for $R^3$, out of the two codebooks provided, given by $$C = \begin{bmatrix} c_1^{(1)} & R_1\begin{pmatrix} c_2^{(2)} \\ 0 \end{pmatrix} & R_1\begin{pmatrix} R_2\begin{pmatrix} 1 \\ 0 \end{pmatrix} \\ 0 \end{pmatrix} \end{bmatrix} = \begin{bmatrix} -0.1266 & 0.5852 & -0.8010 \\ 0.5723 & -0.6164 & -0.5408 \\ 0.8102 & 0.5269 & 0.2569 \end{bmatrix}$$

Figure 6:
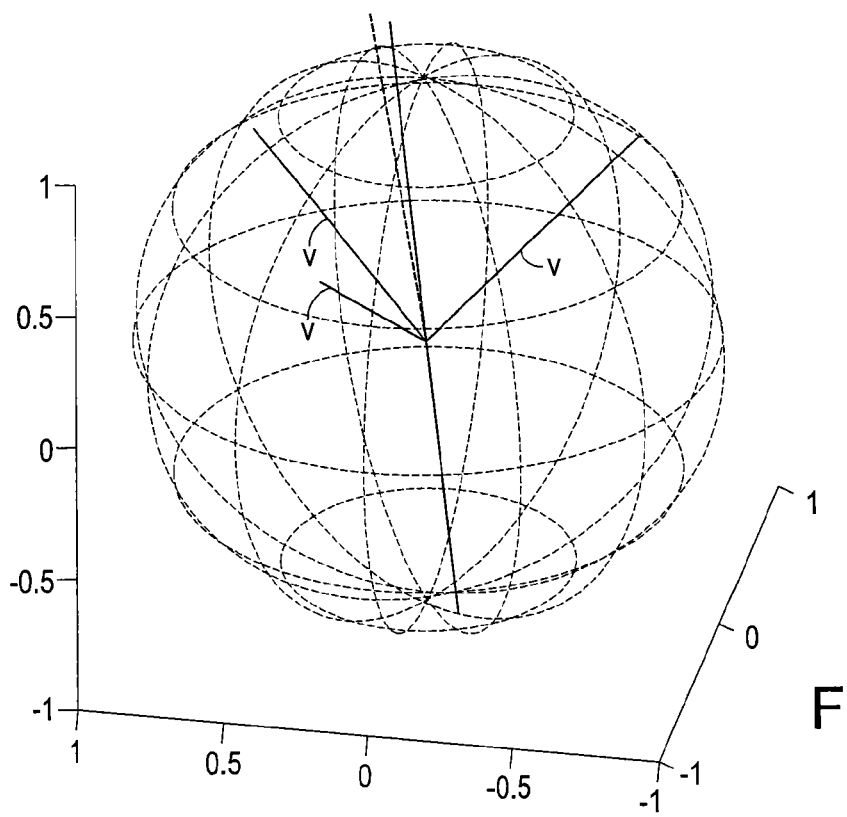
FIG. 6 is a graph depicting a final condition of the encoding process.

The three orthogonal vectors (V) are depicted in FIG. 6. This new reference system has the following property that makes it appealing for directional representation of v. The following vector will now be considered in the new set of coordinates:

$$\hat{v}_3^* = \begin{bmatrix} 1 \\ \alpha_1 \\ \alpha_2 \end{bmatrix},$$

such that $$\hat{v}_2^* = \begin{bmatrix} 1 \\ \alpha_1 \\ 0 \end{bmatrix}, \text{ and } \hat{v}_1^* = \begin{bmatrix} 1 \\ 0 \\ 0 \end{bmatrix},$$

are described as the two truncated representations. In the old set of coordinates the three vectors read $$\hat{v}_1 = C\hat{v}_1^* = [-0.1266\ 0.5723\ 0.8102]^T,$$

$$\hat{v}_2 = C\hat{v}_2^* = [0.2039\ 0.2243\ 1.1077]^T,$$

$$\hat{v}_3 = C\hat{v}_3^* = [0.0724\ 0.1355\ 1.1499]^T.$$

The three vectors are plotted in FIG. 6 in dash-dot line. The chord distances between these vectors and the original vector v can be shown to be equal to $$d(v, \hat{v}_1) = \sin\theta_1 = 0.5069,$$

$$d(v, \hat{v}_2) = \sin\theta_1 \sin\theta_2 = 0.1415,$$

$$d(v, \hat{v}_3) = \sin\theta_1 \sin\theta_2 \sin\theta_3 = 0.$$

The three distortion functions are separable functions of the distortions introduced by each directional quantisation stage. This property allows the codebooks to be designed $C^{(1)}$, $C^{(2)}$ separately for minimum chordal distortion in $R^3$, $R^2$ respectively.

Coded Message

Several different message formats can be used to encode the above vector decomposition, such that reconstruction of vectors $\hat{v}_1$, $\hat{v}_2$, or $\hat{v}_3$ at the decoder is possible, depending on the refinement depth. The reference axes (i.e. quantisation directions) can be represented exactly by a codebook index, while the last possible basis direction is fully determined by the previous stages. For the scalar coefficients it is necessary to provide a finite-bit representation. For this reason it is convenient to adopt the representation of the combination coefficients given in (3)-(4). The floating point representation of the coded message, for each stages, which allows perfect reconstruction of the vector v direction, after three stages, is given by $$i_1 | i_2, \alpha_1 | \alpha_2.$$

It can be shown that, by representing the "phase" of the combination coefficients (i.e. their sign in the real case) with 1 bit for the real case and 2 bits for the complex case, refinement can be guaranteed, even if no bits are used for representing the amplitude of the same coefficients. The strategy consists in setting a fixed threshold for each combination coefficients: if the amplitude of the coefficient is smaller than the pre-defined threshold, then the encoder stops the refinement process (i.e. the coefficient is replaced by zero), if it is larger or equal, the refinement stage is carried out and the amplitude of the coefficient is quantised with the requested number of bits (which can be zero). These threshold values are intended as parameters of the codec, which are known to both the encoder and decoder, and can be optimised for minimum average distortion, for any particular codec configuration. Besides, they can be fixed or periodically adjusted.

As an example, it is assumed that it is desired to expend 2 bits for the representation of each combination coefficient in the above case. The thresholds for an isotropic input vector distribution and a uniform quantiser are optimised, which yields the values $\epsilon_1 = 0.3848$, $\epsilon_2 = 01296$.

The maximum values of the coefficients, which determine the boundaries of the uniform quantisers, can be determined from the maximum distortions of codebooks $C^{(1)}$, $C^{(2)}$. It can be noted that $C^{(1)}$ corresponds to a cube in $R^3$, therefore its maximum chordal distortion, which follows from basic geometrical properties, is $d_{max}^{(1)} = \sqrt{2/3}$. The maximum chordal distortion of codebook $C^{(2)}$ is also trivially found to be $d_{max}^{(2)} = \sin(\pi/8)$. The two coefficients $\alpha_1$, $\alpha_2$ are then bounded by $$-2 \le \alpha_1 \le 2, -\tan\frac{\pi}{8} \le \alpha_2 \le \tan\frac{\pi}{8}.$$

Figure 7:
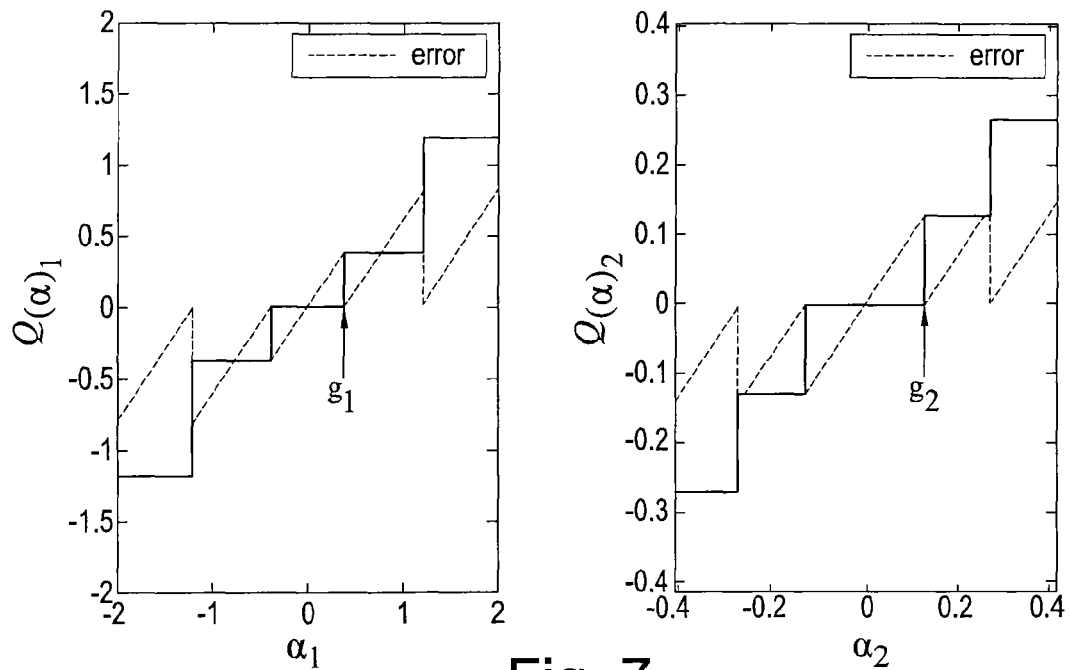
FIG. 7 is a graph illustrating a quantisation step of the described process.

The characteristics of the two uniform quantisers are drawn in FIG. 7.

It can be shown that, if $|\alpha_1| < \epsilon_1$, it cannot be guaranteed in general that the reconstruction $\hat{v}_2$ has a smaller distortion than $\hat{v}_1$. Similarly, if $|\alpha_2| < \epsilon_2$, the reconstruction $\hat{v}_3$ does not necessarily have lower distortion than $\hat{v}_2$. Therefore, when using the quantisers of FIG. 7, the refining of the vector description is stopped if the combination coefficient falls below the threshold at a given stage.

Figure 8:
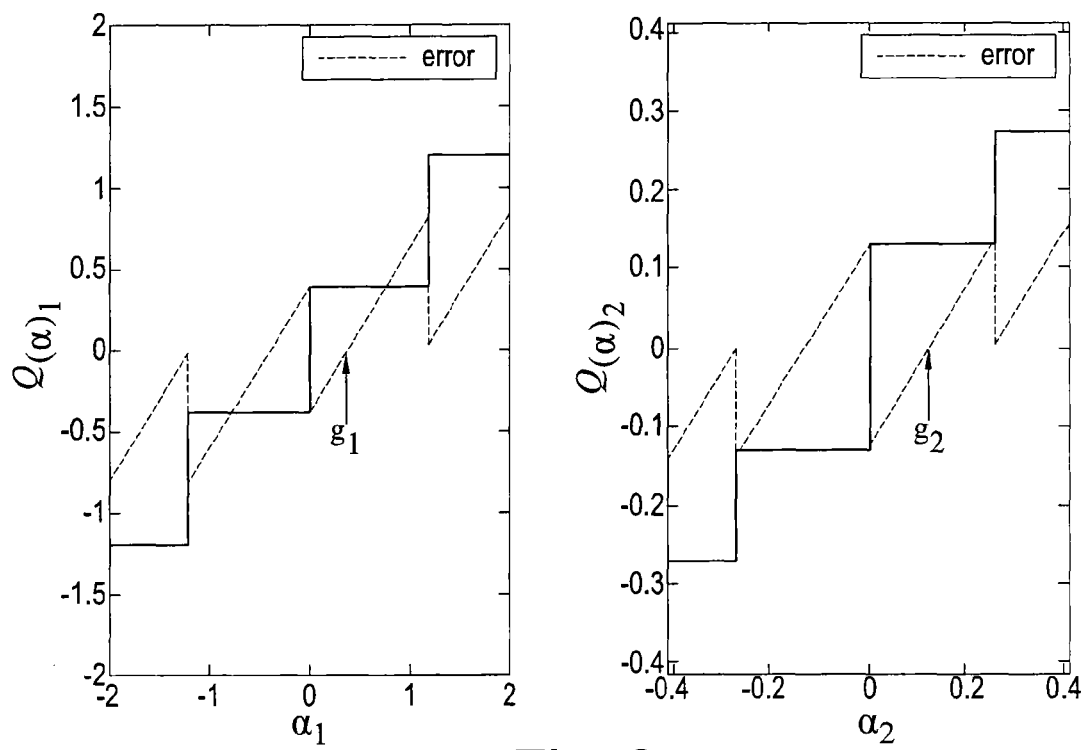
FIG. 8 is a graph illustrating a quantisation step of the described process in an alternative configuration.

In a different implementation, it may be decided to refine the vector description up to a given depth in all cases, by slightly modifying the characteristics of the scalar quantisers as shown in FIG. 8. This is possible because the reconstruction error thereby introduced when the amplitude of the coefficient falls below the threshold is not catastrophic in nature, and actually there are good chances that the refined description still has a smaller distortion.

In the particular example herein, the two pairs of quantisers give out the same result, because both coefficients exceed the threshold, as can be seen from (3)-(4). The coded message in the three possible refinement stages, then reads $$i_1 | i_2, Q(\alpha_1) | Q(\alpha_2). \quad (5)$$

In terms of number of bits, the first message in this example consists of a 2-bit index, the first refinement stage (second message) requires 4 bits in total (2-bit index and 2 bits for the reconstruction coefficient), while the last message (second refinement stage) contains 2 bits for the coefficient. By adjusting the codebook sizes and the resolution of the scalar quantisers, it is possible to have coded messages with the same size for all refinement stages.

Decoder

The decoder can reconstruct the three estimates of the direction of v, for the three possible encoding stages, from the coded message (5), by using the following formulas $$\hat{v}_1 = c_{i_1}^{(1)} = \begin{bmatrix} -0.1266 \\ 0.5723 \\ 0.8102 \end{bmatrix}, \hat{v}_2 = c_{i_1}^{(1)} + Q(\alpha_1)R_1 \begin{bmatrix} c_{i_2}^{(2)} \\ 0 \end{bmatrix} = \begin{bmatrix} 0.0986 \\ 0.3351 \\ 1.0129 \end{bmatrix},$$

$$\hat{v}_3 = c_{i_1}^{(1)} + Q(\alpha_1)R_1 \begin{bmatrix} c_{i_2}^{(2)} + Q(\alpha_2)R_2 \begin{bmatrix} 1 \\ 0 \end{bmatrix} \\ 0 \end{bmatrix} = \begin{bmatrix} 0.0148 \\ 0.2785 \\ 1.0398 \end{bmatrix}.$$

As noted above, the transformation matrices $R_1$, $R_2$ are uniquely identified by vectors $c_{i_1}^{(1)}$, $c_{i_2}^{(2)}$, respectively, by the convention of nulling the last element in the error vectors, and by the assumption that they correspond to a single plane-rotation. The codec, with quantised reconstruction coefficients, produces the following chordal distortion in this numerical example $$d(v, \hat{v}_1) = 0.5069,$$

$$d(v, \hat{v}_2) = 0.2024,$$

$$d(v, \hat{v}_3) = 0.1517.$$

Distortion-Rate Performance

In order to evaluate how efficient the encoding scheme is in refining the description of a vector direction, the distortion-rate curve for an isotropic input distribution in $R^4$ is compared with the distortion-rate performance of a single-stage minimum chord-distance quantisation.

A 2-bit vector codebook is used for the first quantisation stage and a 1-bit vector codebook for the first two refinement stages. In the third and last possible refinement stage the 1-bit vector codebook degenerates in a 1-bit scalar quantisation of the reconstruction coefficient $\tan\theta_2 \cos\theta_3$. The real combination coefficients (0-bit quantisation) for the first two refinement stages are not encoded, while one bit is used for the phase coefficient, which is enough to encode the phase information exactly in the real case.

Therefore, each of the four possible quantisation stages generates a 2-bit coded message. For the single-stage directional vector quantisation, the best known Grassmannian line packings are used.

Figure 9:
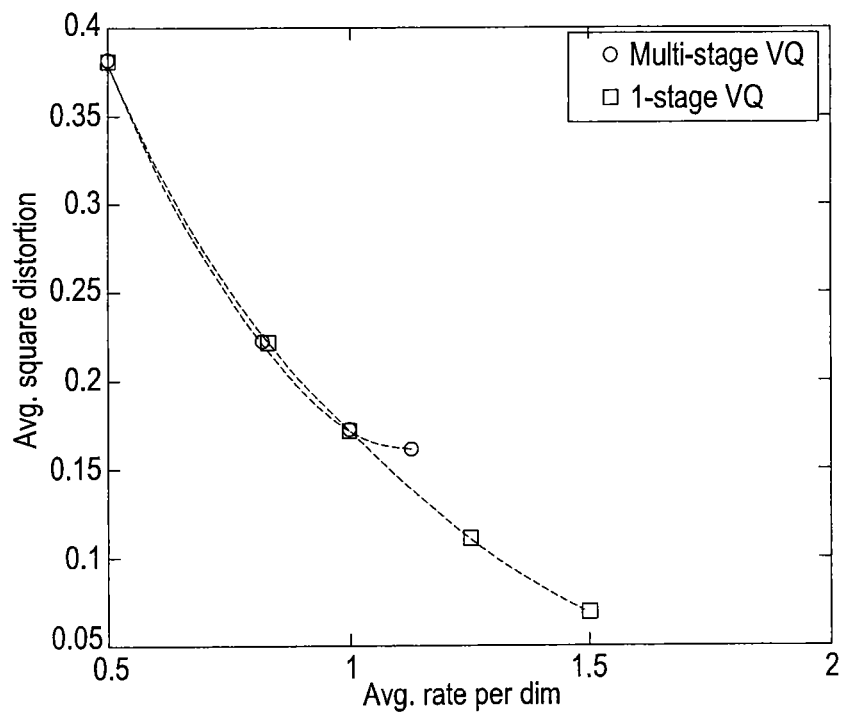
FIG. 9 is a graph of empirical distortion rate functions for the quantisation illustrated in FIGS. 7 and 8, for a real input.
Figure 10:
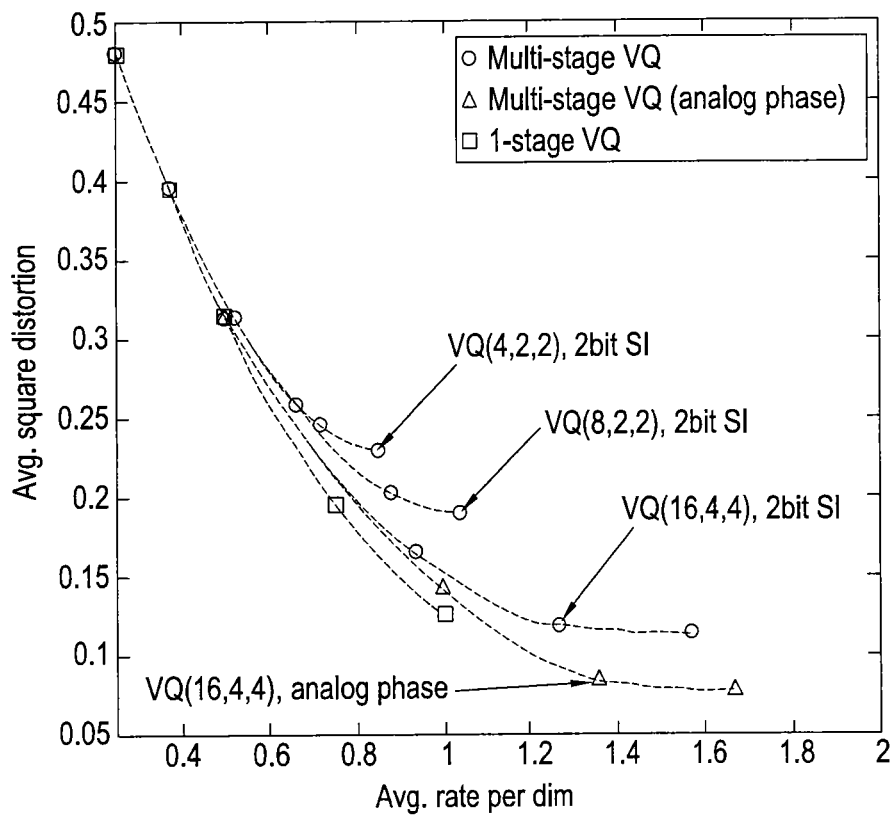
FIG. 10 is a graph of empirical distortion rate functions for the quantisation illustrated in FIGS. 7 and 8, for a complex input.

FIG. 9 shows the distortion-rate curves for the real 4-dimensional case. In FIG. 10 the results for a complex isotropic input vector distribution in $R^4$ are shown. The notation VQ(16,4,4) indicates that Grassmannian packings of 16, 4 and 4 lines have been used as vector codebooks in the first, second and third vector quantisation (VQ) stage, respectively. The number of bits used for the phase of each reconstruction coefficient is also shown, which is denoted as side-information (SI). No bit is used for encoding the amplitude of these coefficients. By "analog phase" the present disclosure presents the case with entropy coding of the phase information.

Further variations, modifications and additional features will be apparent to the skilled person considering the above disclosure and no statement above is intended to limit the scope of protection sought for the invention, which is to be determined by reference to the appended claims, interpreted in the light of but not specifically limited to, the above description of specific embodiments.

The invention claimed is:

1. A method of encoding a channel signature of signals received by a mobile station from a plurality of antennas of a base station, the method comprising
   decomposing a matrix indicating the channel signature into at least a first vector, a second vector and a phase correction to the vectors;
   quantising the phase correction; and
   encoding the matrix as a plurality of indications, the plurality of indications being indicative of at least the first vector, the second vector and the quantised phase correction.

2. A method according to claim 1, wherein the plurality of indications comprise indices for entries in a codebook.

3. The method of claim 1, further comprising transmitting an indication of a first codebook index and a second codebook index to the base station.

4. The method of claim 3, wherein the indication of the first codebook index and the second codebook index are periodically transmitted to the base station.

5. A non-transitory computer readable carrier medium carrying processor executable instructions which when executed on a processor cause the processor to carry out a method according to claim 1.

6. A wireless communication apparatus operable to receive signals from a plurality of antennas of a base station, the wireless communication apparatus comprising a processor operable to decompose a matrix indicating the channel signature into at least a first vector, a second vector and a phase correction to the vectors; quantise the phase correction; and
   encode the matrix as a plurality of indications, the plurality of indications being indicative of at least the first vector, the second vector and the quantised phase correction.

7. The wireless communication apparatus of claim 6, wherein the plurality of indications comprise indices for entries in a codebook.

8. The wireless communication apparatus of claim 6, further comprising an antenna configured to transmit an indication of a first codebook index and a second codebook index to the base station.

9. The wireless communication apparatus of claim 8, wherein the antenna is configured to periodically transmit the indication of the first codebook index and the second codebook index to the base station.

* * * * *